(12) United States Patent
Liang et al.

(10) Patent No.: US 12,550,720 B2
(45) Date of Patent: Feb. 10, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Zheng-Yong Liang, Hsinchu (TW); Wei-Ting Yeh, Hsinchu (TW); Yu-Yun Peng, Hsinchu (TW); Keng-Chu Lin, Ping-Tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 378 days.

(21) Appl. No.: 18/303,588

(22) Filed: Apr. 20, 2023

(65) Prior Publication Data

US 2024/0355733 A1   Oct. 24, 2024

(51) Int. Cl.
*H01L 23/528* (2006.01)
*H01L 21/768* (2006.01)
*H01L 23/373* (2006.01)
*H01L 23/522* (2006.01)

(52) U.S. Cl.
CPC .... *H01L 23/5283* (2013.01); *H01L 21/76898* (2013.01); *H01L 23/3738* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2015/0255380 A1* | 9/2015 | Chen | H01L 23/367 361/707 |
| 2017/0062383 A1* | 3/2017 | Yee | H01L 24/20 |
| 2018/0012857 A1* | 1/2018 | Lin | H01L 21/561 |
| 2019/0043906 A1* | 2/2019 | Wu | H10F 39/804 |
| 2022/0099887 A1* | 3/2022 | Yu | H01L 24/19 |

* cited by examiner

*Primary Examiner* — Khaja Ahmad
(74) *Attorney, Agent, or Firm* — JCIPRNET

(57) ABSTRACT

A semiconductor structure and a manufacturing method thereof are provided. A semiconductor structure includes a first nitride-containing layer on a side of a carrier substrate, first semiconductor devices thermally coupled to the first nitride-containing layer, a first interconnect structure physically and electrically coupled to first sides of the first semiconductor devices, and a first metal-containing dielectric layer bonding the first nitride-containing layer to the first interconnect structure. A thermal conductivity of the first nitride-containing layer is greater than a thermal conductivity of the first metal-containing dielectric layer.

20 Claims, 16 Drawing Sheets

SEMICONDUCTOR STRUCTURE AND MANUFACTURING METHOD THEREOF

BACKGROUND

Technological advances in integrated circuit (IC) materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced high heat density and poor thermal dissipation performance to the semiconductor structure. Increased heat density in three-dimensional system can lead to reliability issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
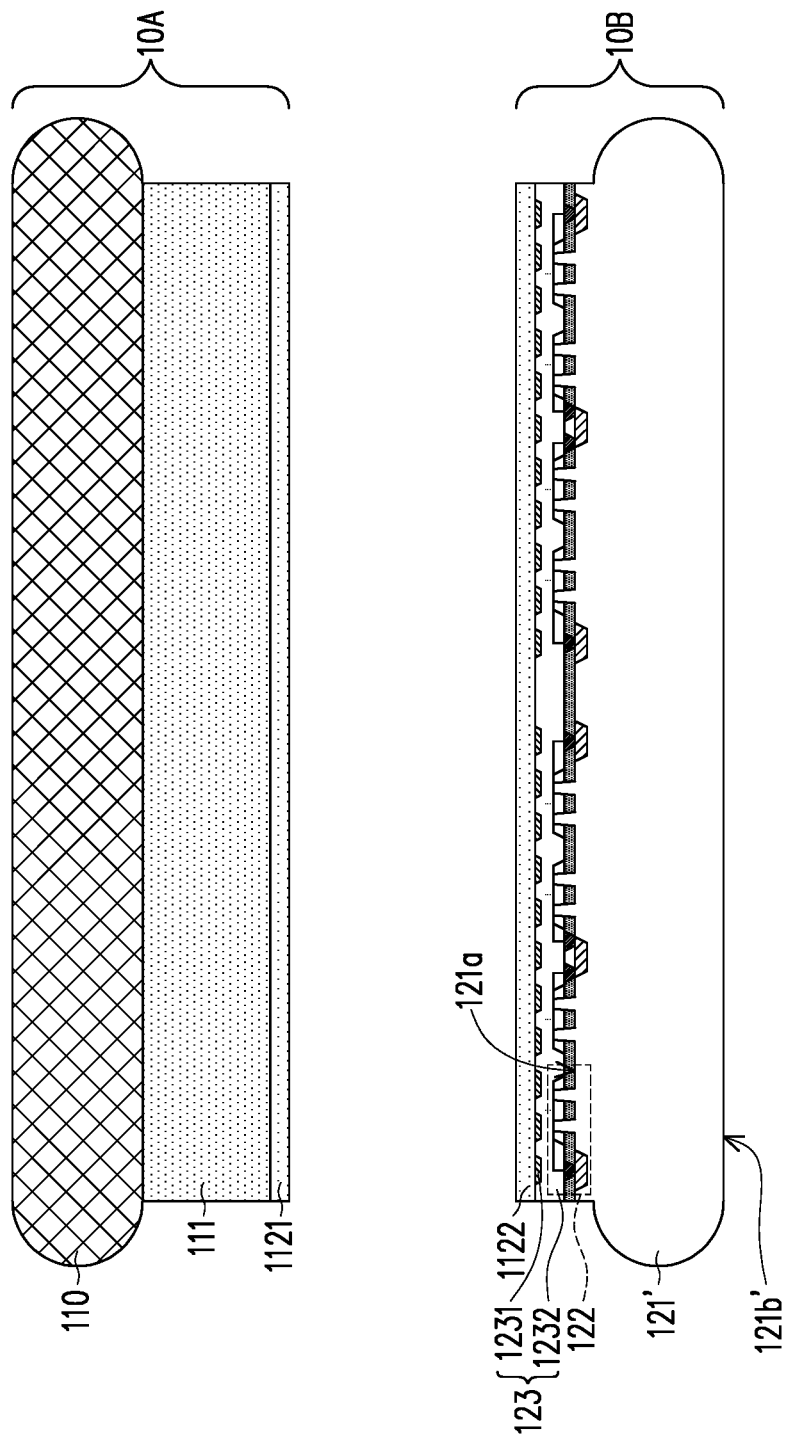
FIGS. 1A-1D are schematic cross-sectional views showing various stages in a manufacturing method of a semiconductor structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1D are schematic cross-sectional views showing various stages in a manufacturing method of a semiconductor structure according to some embodiments. Referring to FIG. 1A, a first portion 10A and a second portion 10B are separately provided. In some embodiments, the first portion 10A includes a carrier substrate 110, a heat dissipation layer 111 disposed on the carrier substrate 110, and a first bonding sublayer 1121 overlying the heat dissipation layer 111. The carrier substrate 110 may be a metal substrate, a semiconductor substrate, a dielectric substrate, or the like. For example, the material of the carrier substrate 110 includes a conductive material (e.g., copper, aluminum, metal alloys, etc.), a semiconductor material (e.g., silicon, germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof), a dielectric material (e.g., glass, PTFE, sapphire, etc.), and/or the like.

The heat dissipation layer 111 may be made of a material having a thermal conductivity greater than 500 W/m-K or even greater than 1000 W/m-K. In some embodiments, the material of the heat dissipation layer 111 includes boron nitride (e.g., cubic boron nitride (c-BN)) or other thermally conductive material which is suitable for protection of electronic devices operating at high temperature. In some embodiments, the c-BN layer overlying the carrier substrate 110 is formed by reactive magnetron sputtering deposition, where a hexagonal phase boron nitride target and a metallic dopant is sputtered with an Ar—$N_2$ mixture which is magnetically enhanced. For example, an RF bias (typically but not necessarily at 13.56 MHz) is applied to the substrate electrode during the deposition. In some embodiments, the RF bias is between about 100 W and about 700 W. For example, the c-BN layer is deposited at a substrate temperature of about a reaction temperature to about 1000° C., e.g., 400° C.

In some embodiments, the deposition of the c-BN layer involves low pressure chemical vapor deposition (LPCVD). For example, a layer of hexagonal boron nitride (h-BN) is formed on the carrier substrate 110 by using LPCVD, magnetron sputtering deposition, or other suitable technique, and then the h-BN layer may be converted into the c-BN layer (e.g., polycrystalline c-BN) by laser annealing the h-BN layer. In some embodiments, during the deposition of the h-BN layer, a KrF excimer laser emitting a light is operated at a laser beam irradiating energy density of about 1 $J/cm^2$ to 5.0 $J/cm^2$ on the carrier substrate 110 heated to about 400° C. The c-BN layer may be formed and controlled through the growth parameters, such as gas composition, substrate temperature, bias voltage, and other deposition parameters. In some embodiments, the laser annealing is done using a pulsed 193 nm ArF laser, a laser beam irradiating energy density of about 0.4 J/cm$^2$ to 1 J/cm$^2$ on the carrier substrate 110 heated to about 400° C., pulse duration of approximately between 1 nanosecond and 100 nanoseconds, and the reactant gas includes air, an inert gas such as N$_2$ or other noble gas. Other suitable methods may be employed to form the c-BN layer on the carrier substrate 110. The heat dissipation layer 111 may have a thickness in a range from about 100 nm to about 5 µm.

In some embodiments, the heat dissipation layer 111 is formed by initially forming a polycrystalline film. The polycrystalline film may have rough surface topography which makes it difficult to form reliable bonding surface thereon. Accordingly, once the layer of polycrystalline film has been formed on the carrier substrate 110, a chemical-mechanical polishing (CMP) process may be performed on the layer of polycrystalline film so that the rough topography of the surface of the heat dissipation layer 111 is reduced for depositing the first bonding sublayer 1121. The surface of the heat dissipation layer 111 on which the first bonding sublayer 1121 will be formed may have a surface roughness less than about 5 angstroms. The first bonding sublayer 1121 may be formed on the heat dissipation layer 111 by using atomic layer deposition (ALD), plasma vapor deposition (PVD), plasma enhanced chemical vapor deposition (PECVD), plasma enhanced ALD (PEALD), thermal ALD, or other suitable deposition method. For example, the first bonding sublayer 1121 is deposited at a reaction temperature less than 300° C. In some embodiments, the first bonding sublayer 1121 is a thin metal oxide layer. The first bonding sublayer 1121 may include one or more oxide of Al, Ti, Ni, Zn, etc. In some embodiments, the first bonding sublayer 1121 is titanium oxide. The thickness of the first bonding sublayer 1121 may be in a range from about 10 nm to about 200 nm. In some embodiments, the thermal conductivity of the heat dissipation layer 111 is greater than that of the first bonding sublayer 1121. For example, the thermal conductivity of the heat dissipation layer 111 is at least 10 times (e.g., 50 times or even 100 times) greater than the thermal conductivity of the first bonding sublayer 1121.

With continued reference to FIG. 1A, the second portion 10B includes a semiconductor substrate 121', a plurality of semiconductor devices 122 formed in/on the semiconductor substrate 121', and a front-side interconnect structure 123 formed over the semiconductor substrate 121' and electrically connected to the semiconductor devices 122. The semiconductor substrate 121' may include a semiconductor material such as silicon, germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate 121' may be a semiconductor-on-insulator (SOI) substrate, a multi-layered substrate, a gradient substrate, or the like. The semiconductor substrate 121' includes an active surface 121a on which the semiconductor devices 122 are formed and a back surface 121b' opposite to the active surface 121a. The semiconductor devices 122 may include active devices (e.g., transistors, diodes, etc.) and/or passive devices (e.g., capacitors, resistors, etc.). In some embodiments, the semiconductor devices 122 are transistors which are formed in oxide definition (OD) areas, and the respective OD area defines an active area for each transistor, i.e., the area where the source/drain regions and channel under the gate electrode of the respective transistor are formed. It is noted that the source/drain region(s) may refer to a source or a drain, individually or collectively dependent upon the context. For example, front-end-of-line (FEOL) processes are performed to form the semiconductor devices 122.

The front-side interconnect structure 123 may be formed over the active surface 121a of the semiconductor substrate 121' and interconnect the semiconductor devices 122 to form an integrated circuit. For example, the front-side interconnect structure 123 is formed of front-side metallization patterns 1231 in front-side dielectric layers 1232. The front-side dielectric layers 1232 may include low-k dielectric layers or the like. The front-side metallization patterns 1231 may include conductive lines and conductive vias, which may be formed in the front-side dielectric layers 1232. The front-side metallization patterns 1231 may be formed of a suitable conductive material, such as copper, tungsten, aluminum, silver, gold, a combination thereof, or the like. The front-side metallization patterns 1231 may be electrically coupled to the semiconductor devices 122. For example, the bottommost conductive vias of the front-side metallization patterns 1231 physically coupled to the gate electrodes of the semiconductor devices 122 are referred to as gate contacts. In some embodiments, middle-end-of-line (MEOL) processes are performed to form the conductive vias landing on the gate electrode regions of the semiconductor devices 122, and back-end-of-line (BEOL) processes are performed to form the front-side interconnect structure 123, where the front-side metallization patterns 1231 may interconnect various elements formed by the FEOL and MEOL processes.

Still referring to FIG. 1A, the second portion 10B may include a second bonding sublayer 1122 formed on the front-side interconnect structure 123. For example, the second bonding sublayer 1122 overlies the topmost layer of the metallization patterns 1231 and/or the topmost one of the dielectric layers 1232. In some embodiments, the second bonding sublayer 1122 is a thin metal oxide layer. The second bonding sublayer 1122 and the first bonding sublayer 1121 may be of the same (or similar) material(s) and may be formed by the same (or similar) method(s).

Figure 1B:
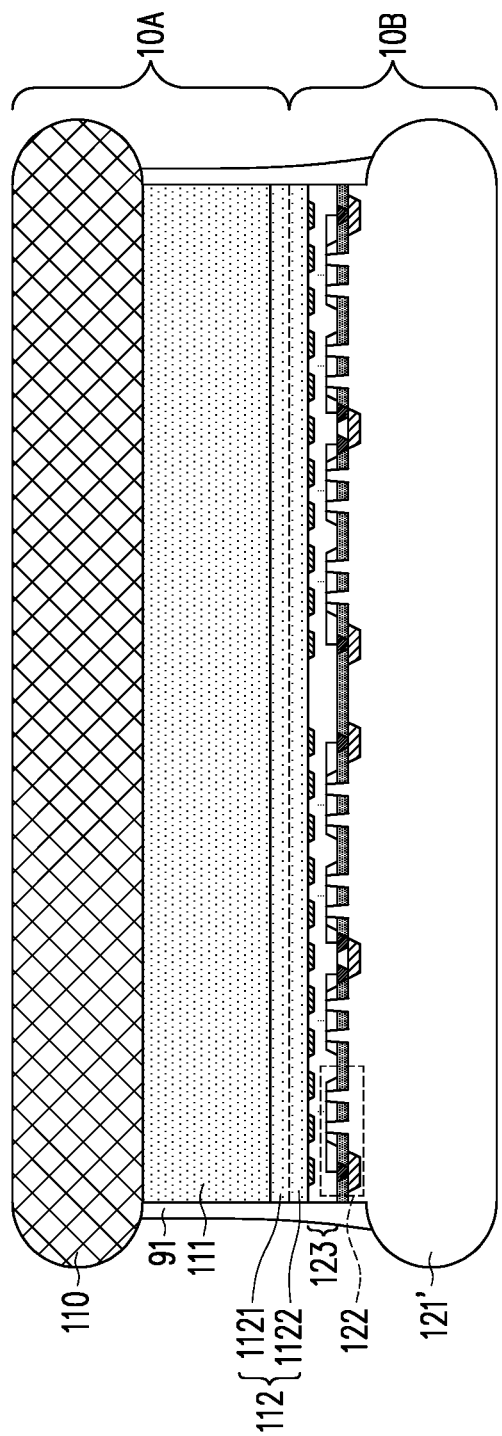

Referring to FIG. 1B, the first portion 10A and the second portion 10B may be bonded together to form a bonded structure. The first bonding sublayer 1121 is bonded to the second bonding sublayer 1122 through, e.g., dielectric-to-dielectric bonding. The bonding process may include a pre-bonding step and an annealing step. In some embodiments, the bonding process includes activating exposed surfaces of the first bonding sublayer 1121 and the second bonding sublayer 1122, contacting the activated surfaces of the bonding sublayers together, and performing the annealing step to strengthen the oxide bonds. For example, the activating process includes wet chemical treating the bonding sublayers with a rinsing fluid, where wet chemical treatment may enable the formation of hydroxyl groups for better bonding. The bonding strength may be improved in the subsequent annealing step. For example, the annealing temperature is greater than about 260° C., and the time range for the annealing process may be greater than 30 seconds and less than 30 minutes. The annealing may be used to recrystallize the amorphous structures in the first bonding sublayer 1121 and the second bonding sublayer 1122. After the annealing, solid bonds, e.g., covalent bonds, may be formed between the first bonding sublayer 1121 and the second bonding sublayer 1122, and the bonded first and second bonding sublayers is collectively viewed as a bonding layer 112. The bonding layer 112 may be a metal-containing dielectric layer, e.g., a metal oxide layer. The bonding layer 112 may have a higher thermal conductivity than a silicon-based bond material (e.g., tetraethylorthosilicate (TEOS), SiO$_2$, etc.).

With continued reference to FIG. 1B, the bonding may be a wafer-to-wafer bonding. For example, the first portion 10A and the second portion 10B are respectively provided in a wafer form, and the wafer-to-wafer bonding may be performed on wafers having a substantially matched size. In some embodiments, before performing the next step, a glue layer 91 is formed to partially (or fully) surround the sidewalls of the bonded structure. For example, the glue layer 91 at least covers the bonding interface between the first portion 10A and the second portion 10B. The glue layer 91 may be a temporary adhesive which provides mechanical and structural support during subsequent processing steps, so that the damage to the bonded structure is reduced.

Figure 1C:
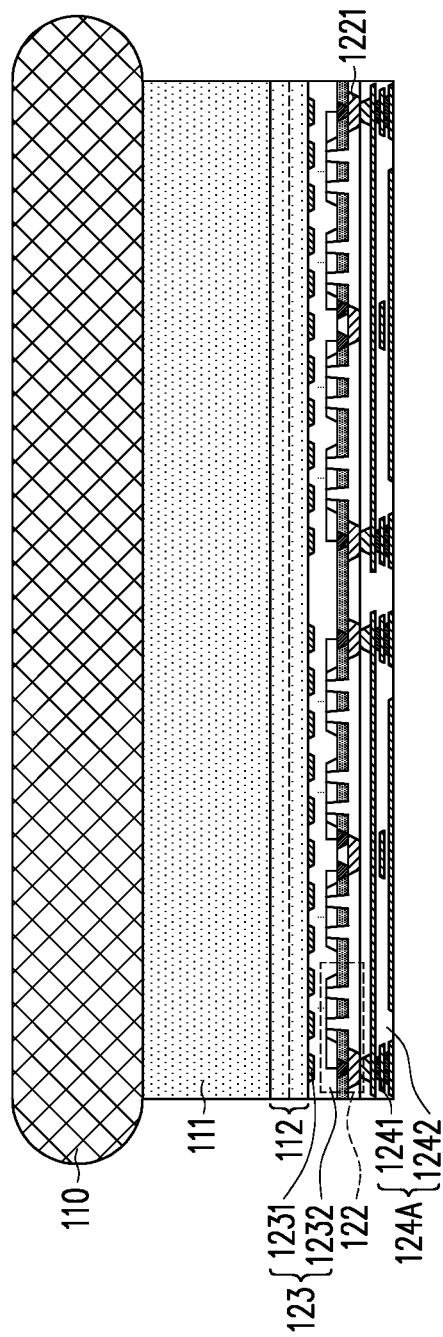

Referring to FIG. 1C and with reference to FIG. 1B, a thinning process may be performed on the backside of the semiconductor substrate 121'. The thinning process may be a CMP process, a grinding process, an etch-back process, a combination thereof, or the like. In some embodiments, after the thinning process, the source/drain regions 1221 of the semiconductor devices 122 are accessibly exposed. For example, the gate electrode is at the first side of the respective semiconductor device 122 to be coupled to the front-side interconnect structure 123, and the source/drain regions 1221 are at the second side of the respective semiconductor device 122 opposite to the first side. The glue layer 91 may provide sufficient mechanical support to resist forces due to the thinning process, and after the thinning process, the glue layer 91 may be removed. In some embodiments, a trimming step for trimming an edge portion of the carrier substrate 110 may be skipped after the thinning process, where the carrier substrate 110 has a second diameter substantially greater than a first diameter of the underlying structure as shown in FIG. 1C.

In some embodiments, a backside interconnect structure 124 may be formed on the exposed second sides of the semiconductor devices 122 and may interconnect the semiconductor devices 122 to form an integrated circuit. For example, the backside interconnect structure 124 is formed of backside metallization patterns 1241 in backside dielectric layers 1242 through the BEOL processes, where the materials of the backside metallization patterns 1241 and the backside dielectric layers 1242 may be the same with (or similar to) those of the front-side metallization patterns 1231 and the front-side dielectric layers 1232. For example, the conductive vias of the backside metallization patterns 1241 are in physical and electrical contact with the source/drain regions 1221 of the semiconductor devices 122. The conductive vias coupled to the source/drain regions 1221 may be referred to as S/D contacts. In some embodiments, the conductive vias of the backside metallization patterns 1241 and the conductive vias of the front-side metallization patterns 1231 are tapered toward opposing directions. For example, the conductive vias of the backside metallization patterns 1241 are tapered toward the carrier substrate 110, and the conductive vias of the front-side metallization patterns 1231 may be tapered in a direction from the carrier substrate 110 to the backside interconnect structure 124.

Figure 1D:
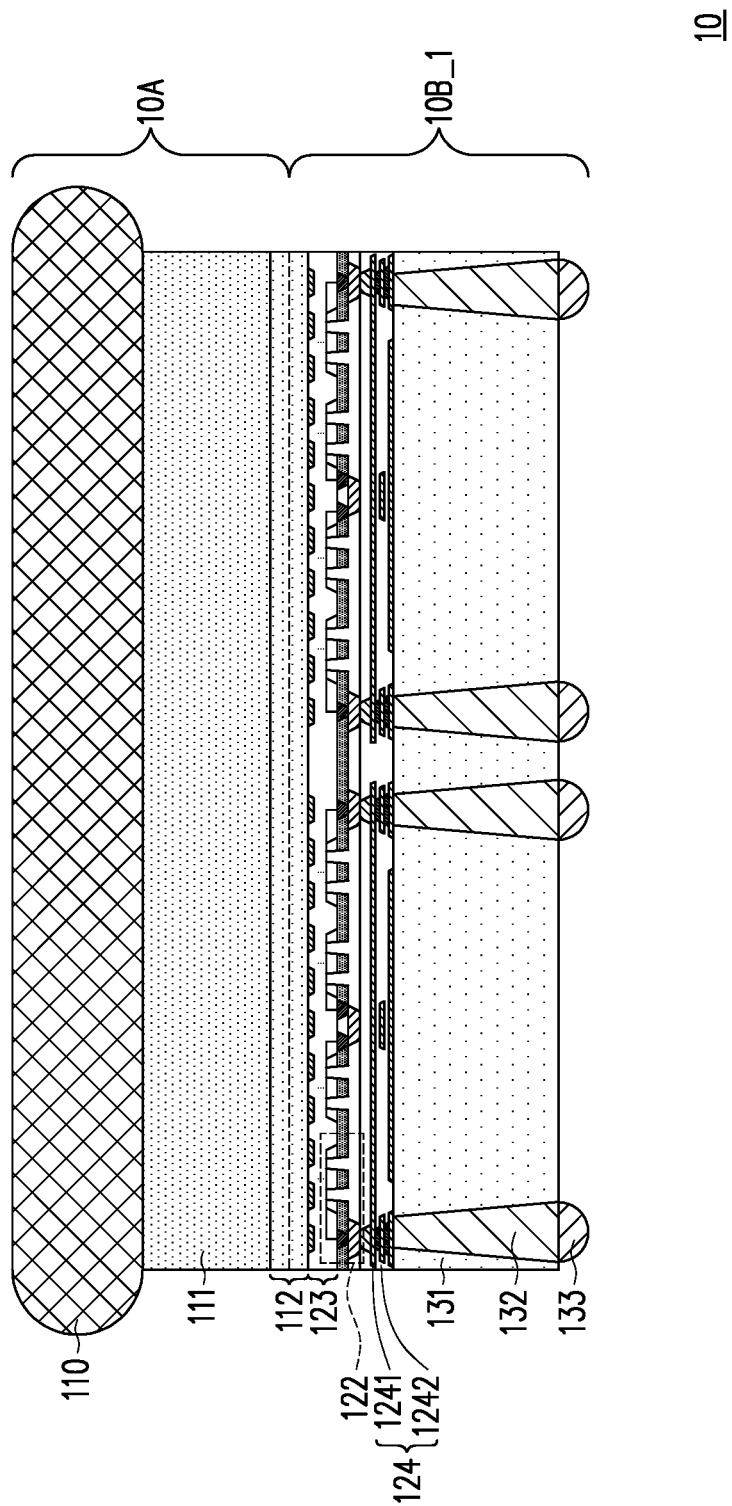

Referring to FIG. 1D, a dielectric layer 131 may be disposed below the backside interconnect structure 124. For example, the dielectric layer 131 includes a low-k dielectric layer or other suitable dielectric material(s). In some embodiments, through vias 132 are formed and extend through the dielectric layer 131. The through vias 132 are formed of conductive materials such as copper, aluminum, tungsten, alloy, a combination thereof, and/or the like. For example, the through vias 132 are physically and electrically coupled to the backside metallization patterns 1241 of the backside interconnect structure 124. In alternative embodiments, the dielectric layer 131 is replaced with a substrate, and through vias 132 are through substrate vias. The through vias 132 may be tapered toward the backside interconnect structure 124 and may be tapered toward the same direction as the tapering direction of the conductive vias in the backside interconnect structure 124. In some other embodiments, the respective through dielectric via 132 has a substantially vertical sidewall.

In some embodiments, a plurality of conductive terminals 133 is formed on the dielectric layer 131 and may be electrical and physical coupled to the through vias 132. The semiconductor devices 122 may be electrically coupled to the conductive terminals 133 through the through vias 132 and the backside metallization patterns 1241. The conductive terminals 133 may be ball grid array (BGA) connectors, solder balls, metal pillars, controlled collapse chip connection (C4) bumps, micro bumps, electroless nickel-electroless palladium-immersion gold technique (ENEPIG) bumps, or the like. In some embodiments, the respective conductive terminal 133 includes a conductive material such as solder, copper, aluminum, gold, nickel, silver, palladium, tin, the like, or a combination thereof.

A semiconductor structure 10 including the first portion 10A and the second portion 10B_1 is then provided as shown in FIG. 1D, where the first portion 10A is stacked upon and bonded to the second portion 10B_1 through the bonding layer 112. The heat generated in the semiconductor devices 122 of the second portion 10B_1 may dissipate to the first portion 10A, and then dissipate to the external environment. The first portion 10A may provide a superior heat dissipation mechanism and can be viewed as a heat dissipation portion of the semiconductor structure 10. The high thermal conductivity of the heat dissipation layer 111 in the first portion 10A ensures this material possesses superior thermal properties. The heat dissipation layer 111 has the thermal conductivity higher than the thermal conductivity of the dielectric layer 131 and also higher than the thermal conductivity of the bonding layer 112. In some embodiments, the thermal conductivity of the heat dissipation layer 111 is at least 10 times (or even 100 times) greater than the thermal conductivity of dielectric layer 131. The heat dissipation layer 111 and the overlying carrier substrate 110 may each have a thickness dependent upon the particular device and the need for heat dissipation.

In some embodiments, the bonding layer 112 of the semiconductor structure 10 not only provides the bonding mechanism for the first portion 10A and the second portion 10B, but also aids in the dissipation of the heat from the second portion 10B_1. For example, the thermal conductivity of the bonding layer 112 is greater than the thermal conductivity of dielectric layer 131 and is also greater than the dielectric layers in both of the front-side interconnect structure 123 and the backside interconnect structure 124. The bonding layer 112, the overlying heat dissipation layer 111, and the overlying carrier substrate 110 provide vertical paths and areas for heat dissipation as indicated by arrows and the vertical paths and areas affect and improve the efficiency of heat dissipation.

Figure 2A:
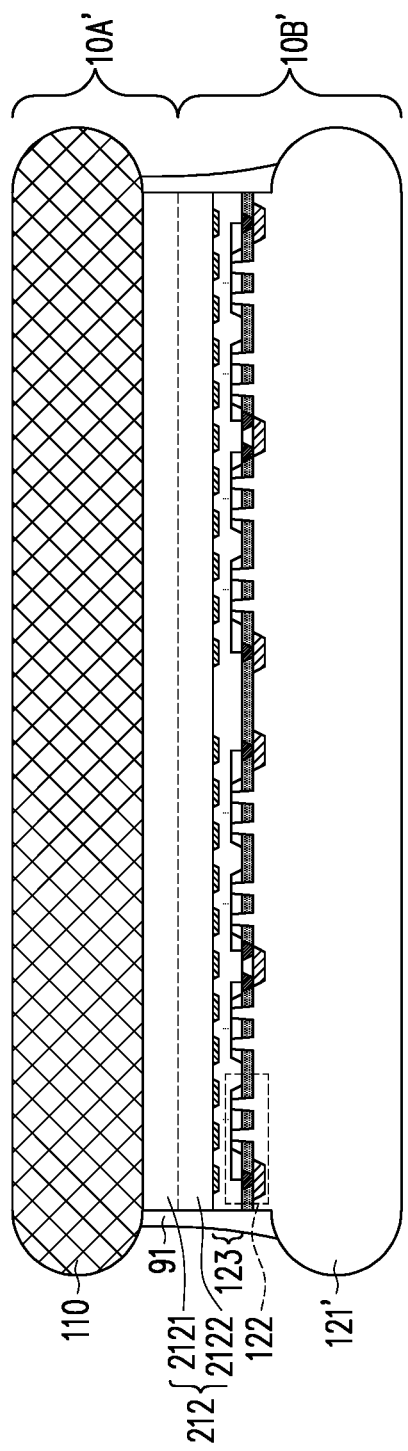
FIGS. 2A-2D are schematic cross-sectional views showing various stages in a manufacturing method of a semiconductor structure according to some embodiments.

FIGS. 2A-2D are schematic cross-sectional views showing various stages in a manufacturing method of a semiconductor structure according to some embodiments. It is noted that the identical/similar components are marked with identical/similar numerals, and for simplicity reason, the identical/similar components are not repeated herein. Referring to FIG. 2A and with reference to FIG. 1B, a first portion 10A' and a second portion 10B' are bonded together to form a bonded structure. The second portion 10B' may be similar to the second portion 10B described in FIG. 1B, except that a second bonding sublayer 2122 of the second portion 10B' is a dielectric (or low-k dielectric) layer instead of a metal oxide layer. In some embodiments, the second bonding sublayer 2122 is formed of a dielectric material substantially free from metal atom. For example, the second bonding sublayer 2122 includes silicon oxide, high density plasma (HDP) oxide, undoped silica glass (USG), TEOS, and/or other suitable bonding material. The first portion 10A' includes the carrier substrate 110 and a first bonding sublayer 2121 underlying the carrier substrate 110. The first bonding sublayer 2121 and the second bonding sublayer 2122 may be the same (or similar) dielectric material(s).

The first portion 10A' may be bonded to the second portion 10B' by fusion bonding the first bonding sublayer 2121 to the second bonding sublayer 2122. The dielectric-to-dielectric (e.g., oxide-to-oxide) bonds may be formed at the interface of the first portion 10A' and the second portion 10B'. After the fusion bonding, the first bonding sublayer 2121 and the second bonding sublayer 2122 may be collectively viewed as a first bonding layer 212. In some embodiments, the first bonding layer 212 is a metal-free dielectric material. The glue layer 91 is optionally formed around the sidewall of the bonded structure to provide mechanical and structural support during subsequent processing steps.

Figure 2B:
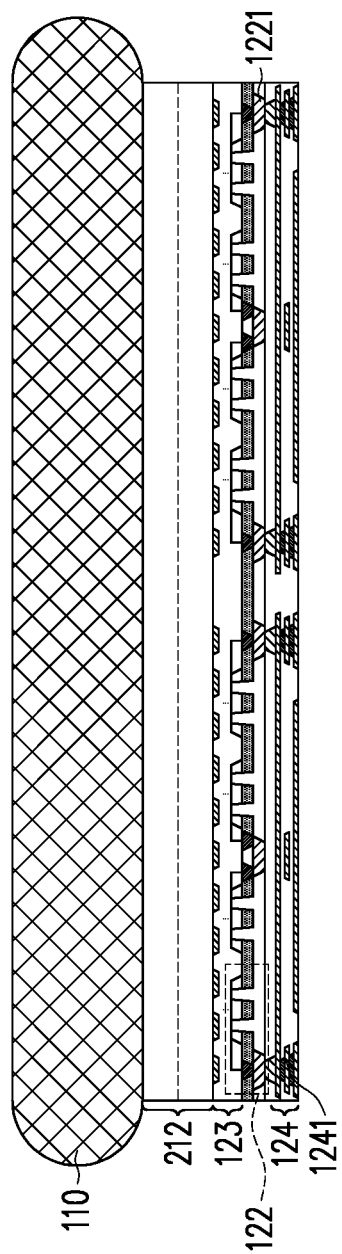

Referring to FIG. 2B and with reference to FIGS. 2A and 1C, the thinning process may be performed on the backside of the semiconductor substrate 121', and then the backside interconnect structure 124 may be formed on the exposed portions of the semiconductor devices 122. For example, the backside metallization patterns 1241 of the backside interconnect structure 124 are electrically and physically coupled to exposed portions of the source/drain regions 1221 of the semiconductor devices 122 so as to form the integrated circuits. In some embodiments, the glue layer 91 is removed after the thinning process. The thinning process, the formation of the backside interconnect structure 124, and the removal of the glue layer 91 may be similar to the processes described in FIG. 1C, and thus the detailed descriptions are not repeated for the sake of brevity.

Figure 2C:
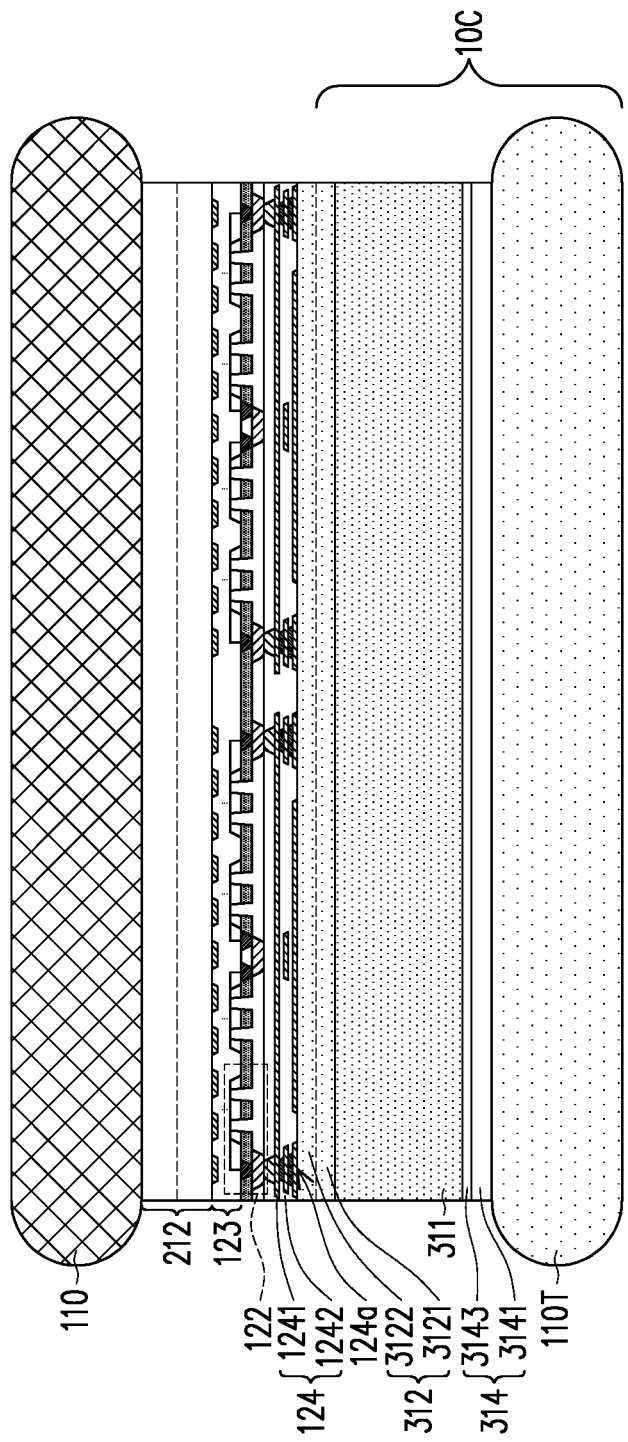

Referring to FIG. 2C, a third bonding sublayer 3122 may be formed on the exposed surface 124a of the backside interconnect structure 124. The third bonding sublayer 3122 may be in direct contact with the bottommost one of the backside dielectric layers 1242. In some embodiments, the third bonding sublayer 3122 is in direct contact with the bottommost one of the backside dielectric layers 1242 and the bottommost backside metallization pattern 1241. The material of the third bonding sublayer 3122 may be similar to that of the first bonding sublayer 1121 as described in FIG. 1A.

In some embodiments, a third portion 10C including a temporary carrier 110T, a de-bonding layer 314 formed on the temporary carrier 110T, a heat dissipation layer 311 overlying the de-bonding layer 314, and a fourth bonding sublayer 3121 overlying the heat dissipation layer 311 is provided. The materials of the temporary carrier 110T, the heat dissipation layer 311, and the fourth bonding sublayer 3121 may be respectively similar to the materials of the carrier substrate 110, the heat dissipation layer 111, and the first bonding sublayer 1121, as described in FIG. 1A. In some embodiments, the temporary carrier 110T is formed of a reusable material, so that the temporary carrier 110T may be recycled for another wafer-level semiconductor process after a subsequent de-bonding process. The third bonding sublayer 3122 may be bonded to the fourth bonding sublayer 3121 to form a second bonding layer 312. The second bonding layer 312 may be similar to the bonding layer 112 as described in FIG. 1B.

The de-bonding layer 314 interposed between the temporary carrier 110T and the heat dissipation layer 111 may include a release sublayer 3141 and a reflection sublayer 3143 overlying the release sublayer 3141. In some embodiments, the materials of the release sublayer 3141 and the reflection sublayer 3143 include metal nitride or other suitable de-bonding material(s). In some other embodiments, the reflection sublayer 3143 is formed of a metal material. In some embodiments, the de-bonding layer 314 includes more than two sublayers, as will be described later in accompanying with FIG. 3A.

Figure 2D:
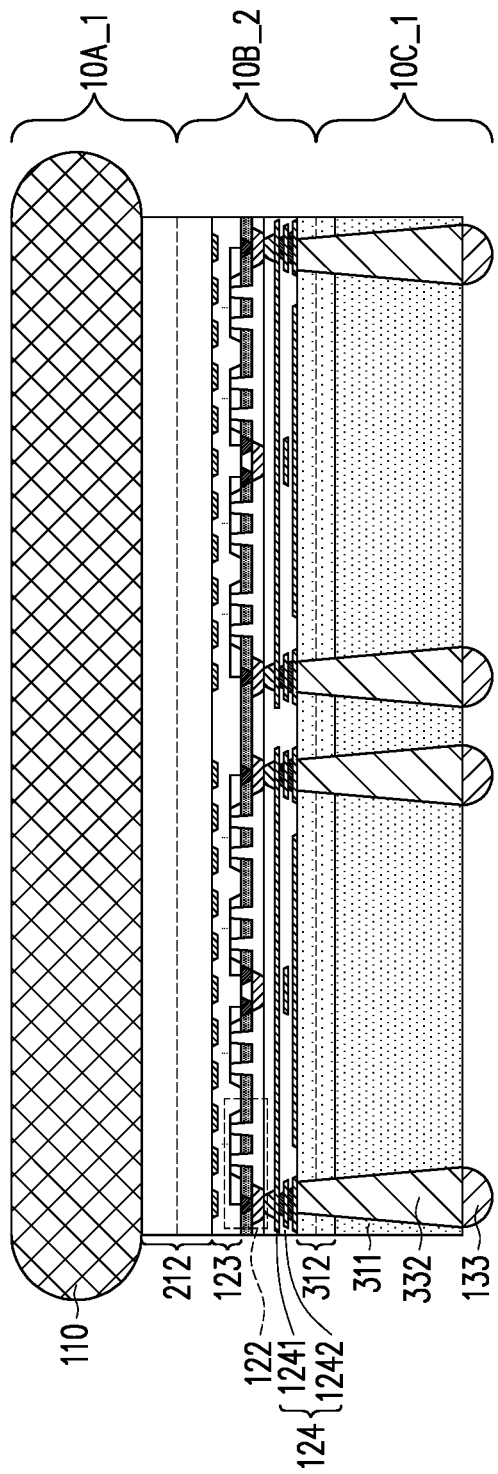

Referring to FIG. 2D and with reference to FIG. 2C, the de-bonding layer 314 and the underlying temporary carrier 110T may be removed to expose the heat dissipation layer 311 through a de-bonding process. In some embodiments, the de-bonding process is a laser de-bonding process. The temporary carrier 110T detached from the overlying structure may be saved and re-used in another wafer-level semiconductor structure manufacturing process, and thus the manufacturing cost can be further reduced. After the de-bonding process, through vias 332 may be formed and extend through the heat dissipation layer 311 and the overlying second bonding layer 312. For example, the through vias 332 are in physical and electrical contact with the bottommost one of the backside metallization patterns 1241. The through vias 332 may be similar to the through vias 132 described in FIG. 1D. In some embodiments, the conductive terminals 133 are formed on the heat dissipation layer 311 and may be electrical and physical coupled to the through vias 332. The conductive terminals 133 may be electrically coupled to the semiconductor devices 122 through the through vias 332 and the backside metallization patterns 1241.

A semiconductor structure 20 including the first portion 10A_1, the second portion 10B_2 underlying the first portion 10A_1, and the third portion 10C_1 underlying the second portion 10B_2 is then provided as shown in FIG. 2D. The first portion 10A_1 and the upper side of the second portion 10B_2 are bonded together through the first bonding layer 212, and the lower side of the second portion 10B_2 and the third portion 10C_1 are bonded together through the second bonding layer 312. For example, the thermal conductivity of the first bonding layer 212 is less than the thermal conductivity of the second bonding layer 312. The thermal conductivity of the second bonding layer 312 may be less than the thermal conductivity of the heat dissipation layer 311. In some embodiments, the thermal conductivity of the heat dissipation layer 311 is at least 10 times greater than the thermal conductivity of the second bonding layer 312 and may be at least 100 times greater than the thermal conductivity of the first bonding layer 212. The heat dissipation ability, i.e. the thermal property, of the heat dissipation layer 311 and/or the second bonding layer 312 is pivotal. The heat dissipation layer 311 and/or the second bonding layer 312 may be used in the semiconductor structure 20 for thermal conductive purposes to dissipate heat away from the second portion 10B_2.

Figure 3A:
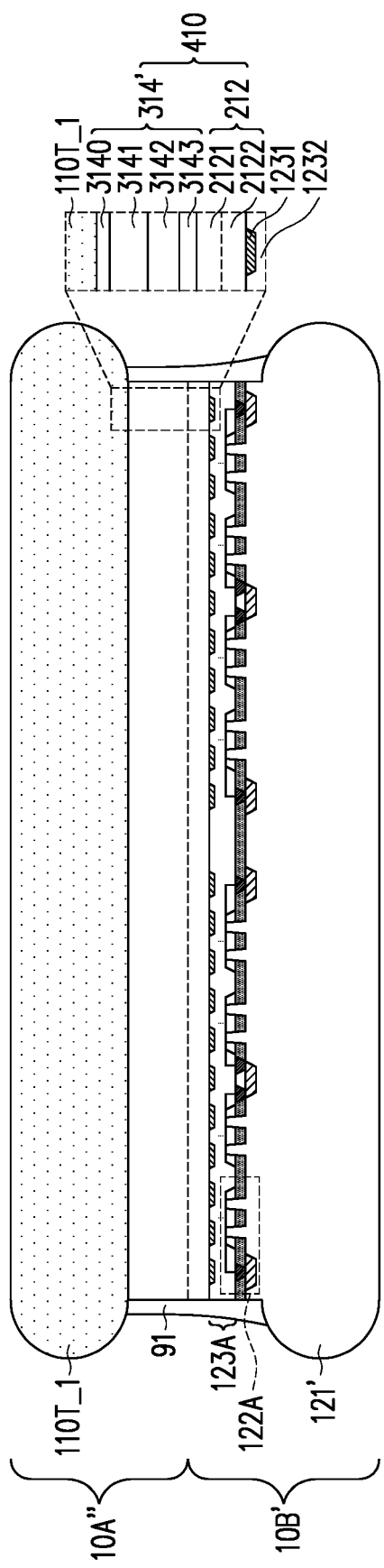
FIGS. 3A-3G are schematic cross-sectional views showing various stages in a manufacturing method of a semiconductor structure according to some embodiments.

FIGS. 3A-3G are schematic cross-sectional views showing various stages in a manufacturing method of a semiconductor structure according to some embodiments. It is noted that the identical/similar components are marked with identical/similar numerals, and for simplicity reason, the identical/similar components are not repeated herein. Referring to FIG. 3A and with reference to FIGS. 2A and 2C, a first portion 10A" and the second portion 10B' are separately provided and then bonded together to form a bonded structure. The second portion 10B' including the first front-side interconnect structure 123A formed on the first semiconductor devices 122A is similar to the second portion 10B' shown in FIG. 2A. The bonded structure shown in FIG. 3A is similar to the bonded structure shown in FIG. 2A, except that a de-bonding layer 314' is interposed between the first temporary carrier 110T_1 and the first bonding sublayer 2121. The de-bonding layer 314' and the underlying bonding layer 212 may be collectively viewed as a sacrificial structure 410 in the sense that they may be ultimately removed, according to some embodiments.

The first temporary carrier 110T_1 may be similar to the temporary carrier 110T described in 2C, and the de-bonding layer 314' may be formed on the first temporary carrier 110T_1. The de-bonding layer 314' includes the release sublayer 3141 and the reflection sublayer 3143 below the release sublayer 3141. In some embodiments, the de-bonding layer 314' further includes a first oxide sublayer 3140 interposed between the first temporary carrier 110T_1 and the release sublayer 3141, a second oxide sublayer 3142 interposed between the release sublayer 3141 and the reflection sublayer 3143. For example, the first oxide sublayer 3140, the release sublayer 3141, the second oxide sublayer 3142, and the reflection sublayer 3143 are sequentially formed on the first temporary carrier 110T_1. The first oxide sublayer 3140 may be used to thermally isolate the first temporary carrier 110T_1 from the underlying structures. For example, the first oxide sublayer 3140 includes silicon oxide or other suitable thermal isolation materials. In some embodiments, the thickness of the first oxide sublayer 3140 is greater than 500 angstroms, although other values of the thickness may be employed. In some embodiments, when the first temporary carrier 110T_1 is exposed to an energy beam, the release sublayer 3141 absorbs the energy that causes the lattice to expand and generates the fractures. For example, the release sublayer 3141 is a film of metal nitride (e.g., TiN) or other suitable de-bond material. In some embodiments, the thickness of the release sublayer 3141 is about 10 nm to about 100 nm, although other values of the thickness may be employed.

In some embodiments, the second oxide sublayer 3142 is considered as a thermal isolation sublayer formed of a dielectric material (e.g., low-k material, TEOS, oxide-based material, etc.). The second oxide sublayer 3142 may be an interlayer for reflection and heat isolation. In some embodiments, the thickness of the second oxide sublayer 3142 is greater than 300 nm, although other values of the thickness may be employed. In some embodiments, the reflection sublayer 3143 is used to protect the underlying first semiconductor devices 122A and save the power energy. For example, the reflection sublayer 3143 is formed of a metal sublayer (e.g., Cu, Ru, etc.) or a metal-containing nitride sublayer (e.g., TiN, TaN, etc.). In some embodiments, the thickness of the reflection sublayer 3143 is greater than 25 nm, although other values of the thickness may be employed. The second oxide sublayer 3142 may have the thickness greater than the release sublayer 3141 and also greater than the reflection sublayer 3143. It should be noted that the de-bonding layer 314' may include more than four sublayers or less than four sublayers depending on the process requirements. The first bonding sublayer 2121 may be formed on the reflection sublayer 3143, and then bonded to the second bonding sublayer 2122. In some embodiments, the first bonding sublayer 2121 acts as a capping layer of the reflection sublayer 3143. After the bonding process, the glue layer 91 may be optionally formed to surround the sidewall of the bonded structure.

Figure 3B:
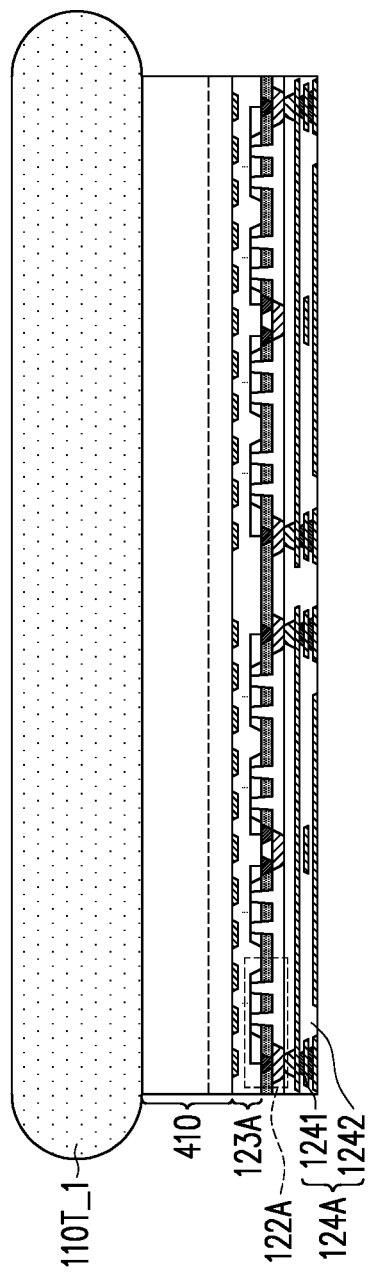

Referring to FIG. 3B and with reference to FIGS. 3A and 2B, the thinning process may be performed on the backside of the semiconductor substrate 121', and then the first backside interconnect structure 124A including the backside metallization patterns 1241 and the backside dielectric layers 1242 may be formed on the exposed portions of the first semiconductor devices 122A. In some embodiments, the glue layer 91 is removed after the thinning process and prior to the formation of the first backside interconnect structure 124A. The thinning process, the formation of the first backside interconnect structure 124A, and the removal of the glue layer 91 may be similar to the processes described in FIG. 1C or 2B, and thus the detailed descriptions are not repeated for the sake of brevity.

Figure 3C:
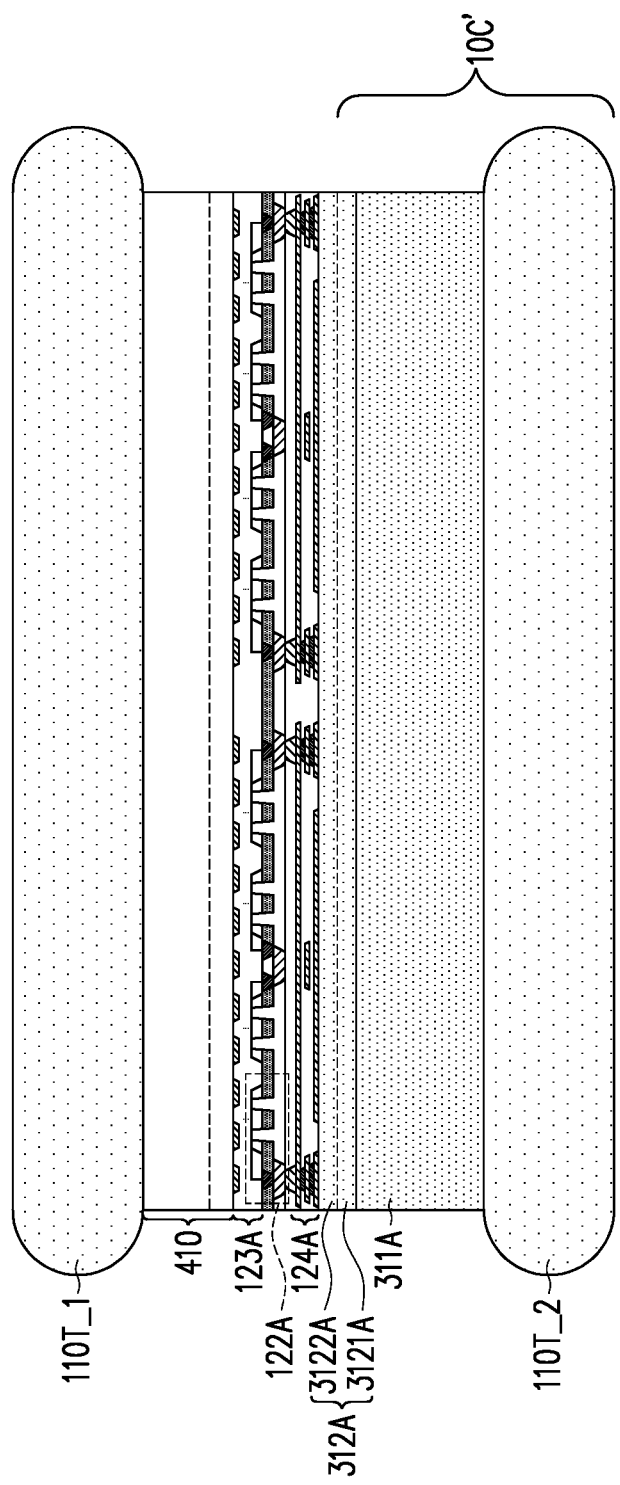

Referring to FIG. 3C and with reference to FIG. 2C, a third bonding sublayer 3122A may be formed on the exposed surface of the first backside interconnect structure 124A. The material of the third bonding sublayer 3122A may be similar to that of the third bonding sublayer 3122 described in FIG. 2C. In some embodiments, a third portion 10C' including a second temporary carrier 110T_2, a first heat dissipation layer 311A overlying the second temporary carrier 110T_2, and a fourth bonding sublayer 3121A overlying the first heat dissipation layer 311A is provided, and then the fourth bonding sublayer 3121A may be bonded to the third bonding sublayer 3122A. After the bonding, the fourth bonding sublayer 3121A and the third bonding sublayer 3122A may be collectively viewed as a first bonding layer 312A. The third bonding sublayer 3122A, the fourth bonding sublayer 3121A, and the first heat dissipation layer 311A may be respectively similar to the third bonding sublayer 3122, the fourth bonding sublayer 3121, and the heat dissipation layer 311, as described in FIG. 2C. The second temporary carrier 110T_2 may be similar to the temporary carrier 110T. In some embodiments, the third portion 10C' is replaced with the third portion 10C described in FIG. 2C.

Figure 3D:
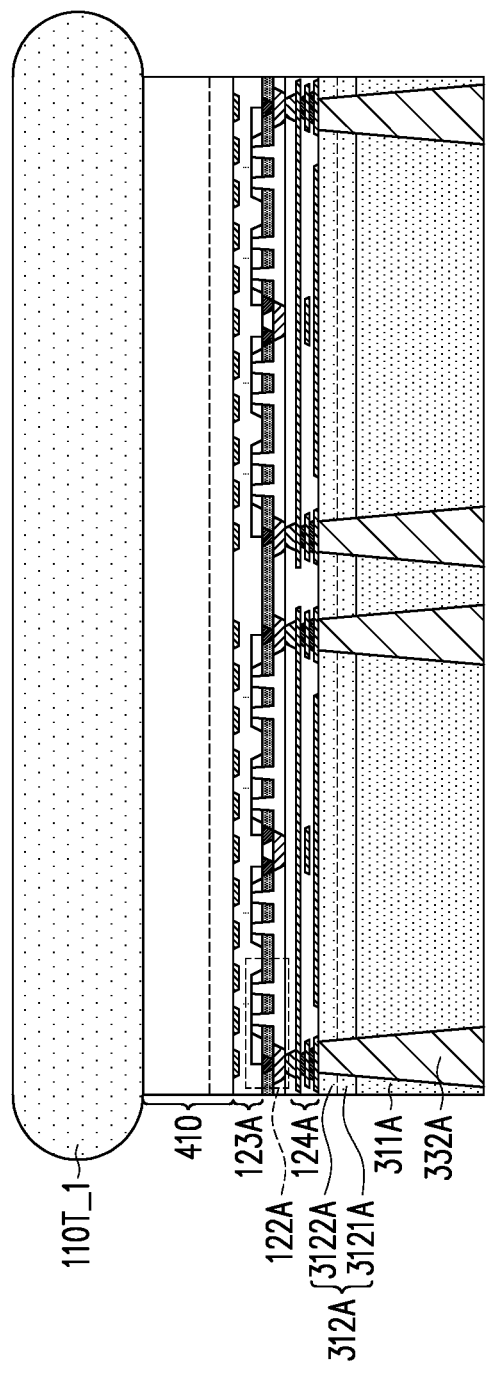

Referring to FIG. 3D and with reference to FIGS. 3C and 2D, the second temporary carrier 110T_2 may be removed to expose the first heat dissipation layer 311A through the de-bonding process, and then first through vias 332A are formed and extend through the first heat dissipation layer 311A and the overlying first bonding layer 312A. The first through vias 332A may be similar to the through vias 232 described in FIG. 2D.

Figure 3E:
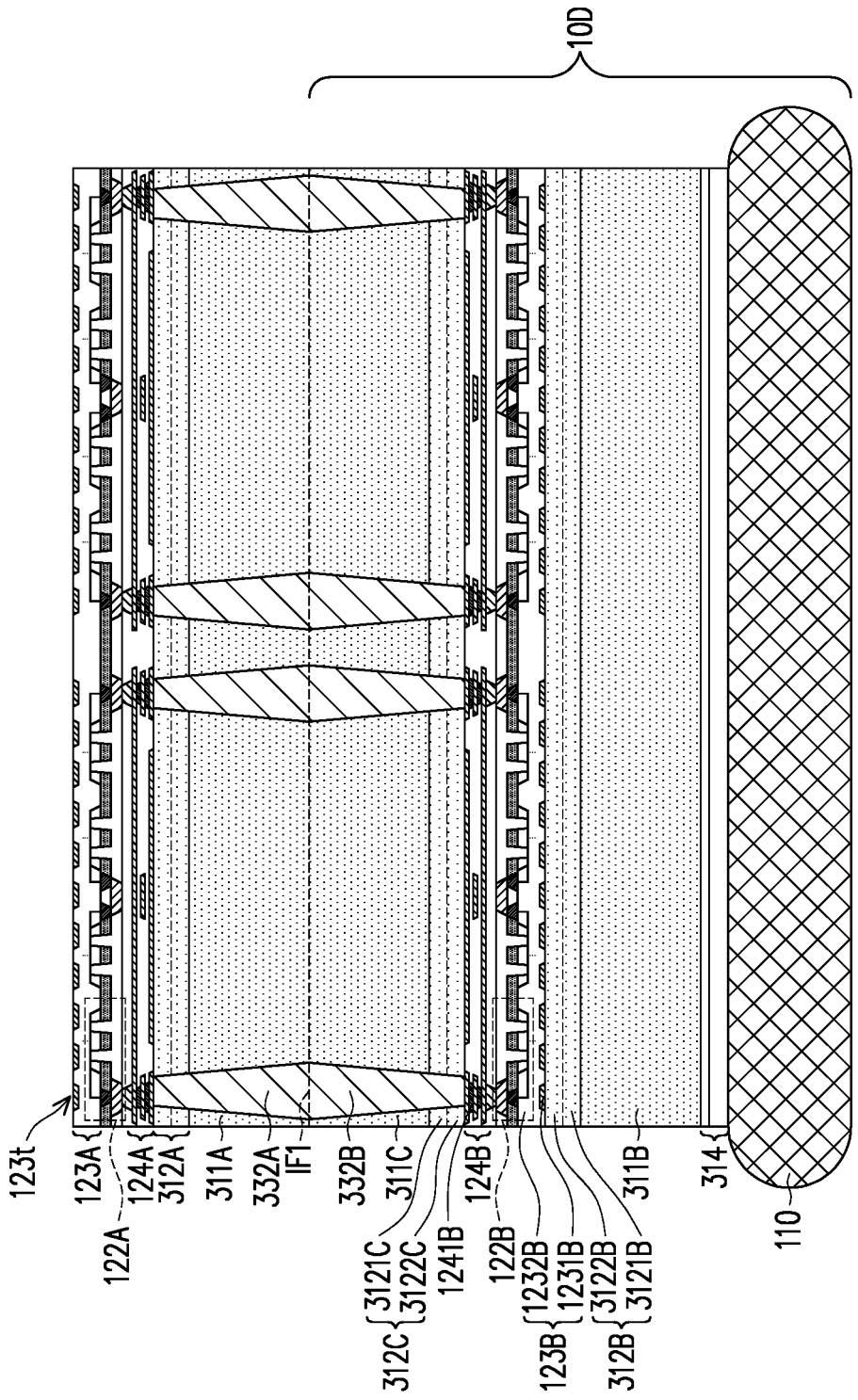

Referring to FIG. 3E and with reference to FIG. 3D, the sacrificial structure 410 may be removed to accessibly reveal the topmost surface 123t of the first front-side interconnect structure 123A. The removal of the sacrificial structure 410 may include a laser de-bonding process, an etching process, a CMP process, a grinding process, a combination thereof, etc. In some embodiments, a fourth portion 10D may be bonded to the first heat dissipation layer 311A and the first through vias 322A. For example, the fourth portion 10D includes the carrier substrate 110, a second heat dissipation layer 311B formed over the carrier substrate 110, a second bonding layer 312B overlying the second heat dissipation layer 311B. In some embodiments, the de-bonding layer 314 is interposed between the carrier substrate 110 and the second heat dissipation layer 311B. Alternatively, the de-bonding layer 314 is omitted or replaced to a thermal interface material layer. For example, the carrier substrate 110, the de-bonding layer 314, the second heat dissipation layer 311B, and the first bonding sublayer 3121B of the second bonding layer 312B may be similar to the elements of the third portion 10C described in FIG. 2C.

In some embodiments, the fourth portion 10D includes a second front-side interconnect structure 123B overlying the second bonding sublayer 3122B of the second bonding layer 312B, second semiconductor devices 122B formed on the front-side metallization patterns 1231B and embedded in the front-side dielectric layers 1232B, a second backside interconnect structure 124B formed on the second semiconductor devices 122B. The second front-side interconnect structure 123B may be similar to the first front-side interconnect structure 123A, except that the conductive vias in the second front-side interconnect structure 123B and the conductive vias in the first front-side interconnect structure 123A are tapered toward the opposing directions. For example, the conductive vias in the first front-side interconnect structure 123A are tapered toward the carrier substrate 110, while the conductive vias in the second front-side interconnect structure 123B are tapered toward the first front-side interconnect structure 123A.

The configuration of the first semiconductor devices 122A may be opposite to that of the second semiconductor devices 122B. For example, the source/drain regions of the second semiconductor devices 122B are disposed at the upper part of the fourth portion 10D, and the gate electrodes of the second semiconductor devices 122B are disposed at the lower part of the fourth portion 10D. The second backside interconnect structure 124B may be similar to the first backside interconnect structure 124A, except that the conductive vias in the second backside interconnect structure 124B and the conductive vias in the first backside interconnect structure 124A are tapered toward the opposing directions. For example, the conductive vias in the first backside interconnect structure 124A are tapered upward, while the conductive vias in the second front-side interconnect structure 124B are tapered downward to the carrier substrate 110.

With continued reference to FIG. 3E, the fourth portion 10D may include a third bonding layer 312C overlying the second backside interconnect structure 124B, a third heat dissipation layer 311C overlying the third bonding layer 312C, and second through vias 332B extending through the third heat dissipation layer 311C and the third heat dissipation layer 311C to be in physical and electrical contact with the topmost layers of the backside metallization patterns 1241B. The third bonding layer 312C may include the first bonding sublayer 3121C underlying the third heat dissipation layer 311C, and the second bonding sublayer 3122C interposed between the first bonding sublayer 3121C and the second front-side interconnect structure 124B. In some embodiments, the third heat dissipation layer 311C is bonded to the first heat dissipation layer 311A, and the second through vias 332B are bonded to the first through vias 332A in a one-to-one correspondence. In some embodiments, the second through vias 332B and the first through vias 332A are tapered toward the opposing directions. For example, the first through vias 332A are tapered upward and the second through vias 332B are tapered downward to the carrier substrate 110. In alternative embodiments, the second through vias 332B and/or the first through vias 332A have substantially vertical sidewalls.

In some embodiments, the interface between the second through vias 332B and the first through vias 332A includes metal-to-metal bonds, and the interface between the third heat dissipation layer 311C and the first heat dissipation layer 311A includes dielectric-to-dielectric bonds. In some embodiments, the interface between the second through vias 332B and the first through vias 332A and the interface between the third heat dissipation layer 311C and the first heat dissipation layer 311A are substantially coplanar and flat. In alternative embodiments, additional bonding features (e.g., dielectric features and/or metallic features) may be formed at the interface IF1.

Figure 3F:
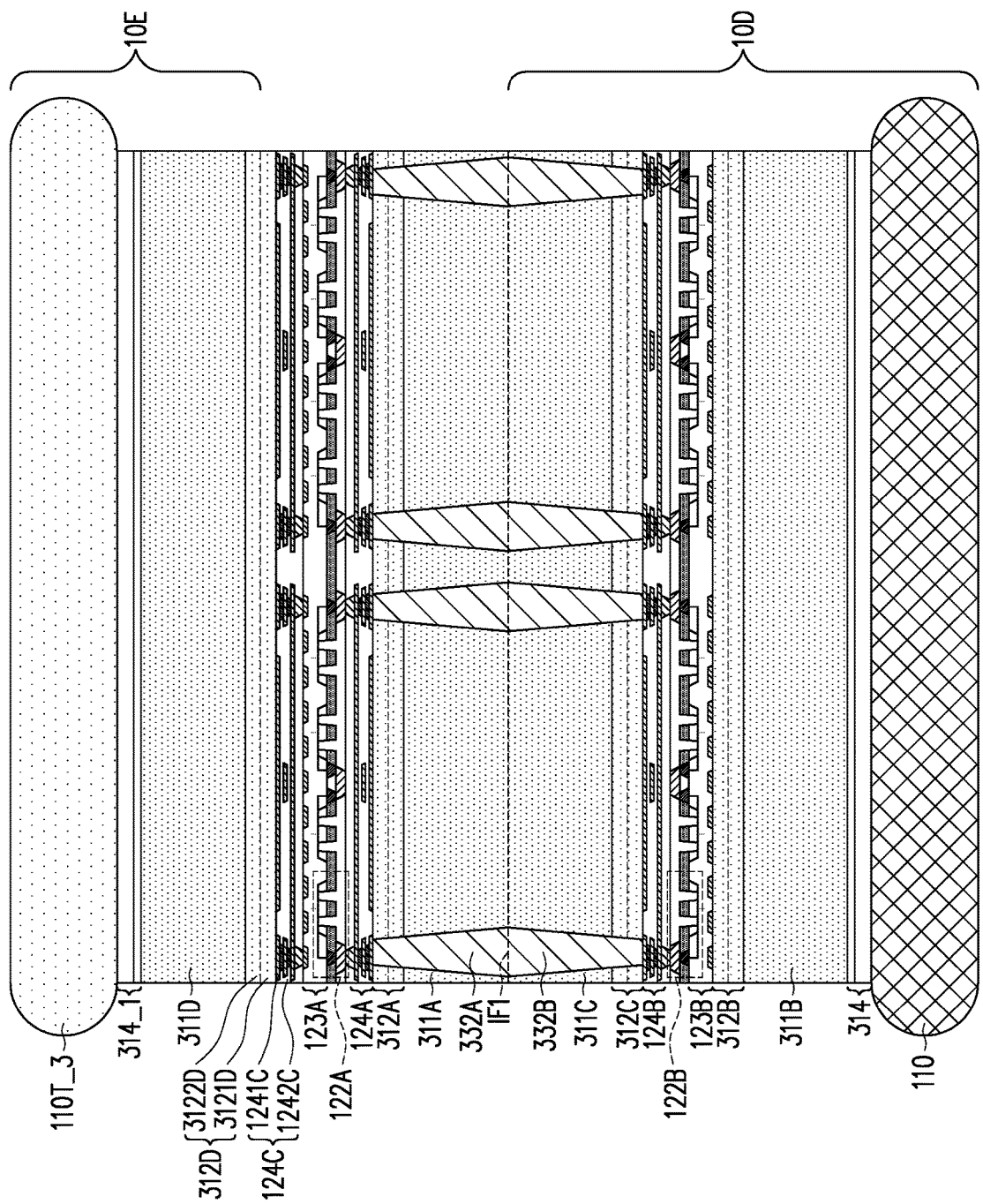

Referring to FIG. 3F and with reference to FIG. 3E, a third interconnect structure 124C including the metallization patterns 1241C and the dielectric layers 1242C may be formed on the topmost surface 123t of the first front-side interconnect structure 123A. The metallization patterns 1241C may be in physical and electrical contact with the topmost one of the metallization patterns in the first front-side interconnect structure 123A. In some embodiments, the conductive vias of the metallization patterns 1241C are tapered toward the same direction as the conductive vias in the first front-side interconnect structure 123A. In some embodiments, the first bonding sublayer 3121D is formed on the third interconnect structure 124C, and then bonded to a fifth portion 10E. For example, the fifth portion 10E includes a third temporary carrier 110T_3, the de-bonding layer 314_1 underlying the third temporary carrier 110T_3, a fourth heat dissipation layer 311D underlying the de-bonding layer 314_1, and a second bonding sublayer 3122D underlying the fourth heat dissipation layer 311D. The fifth portion 10E may be similar to the third portion 10C described in FIG. 2C. The second bonding sublayer 3122D may be bonded to the first bonding sublayer 3121D to form a fourth bonding layer 312D.

Figure 3G:
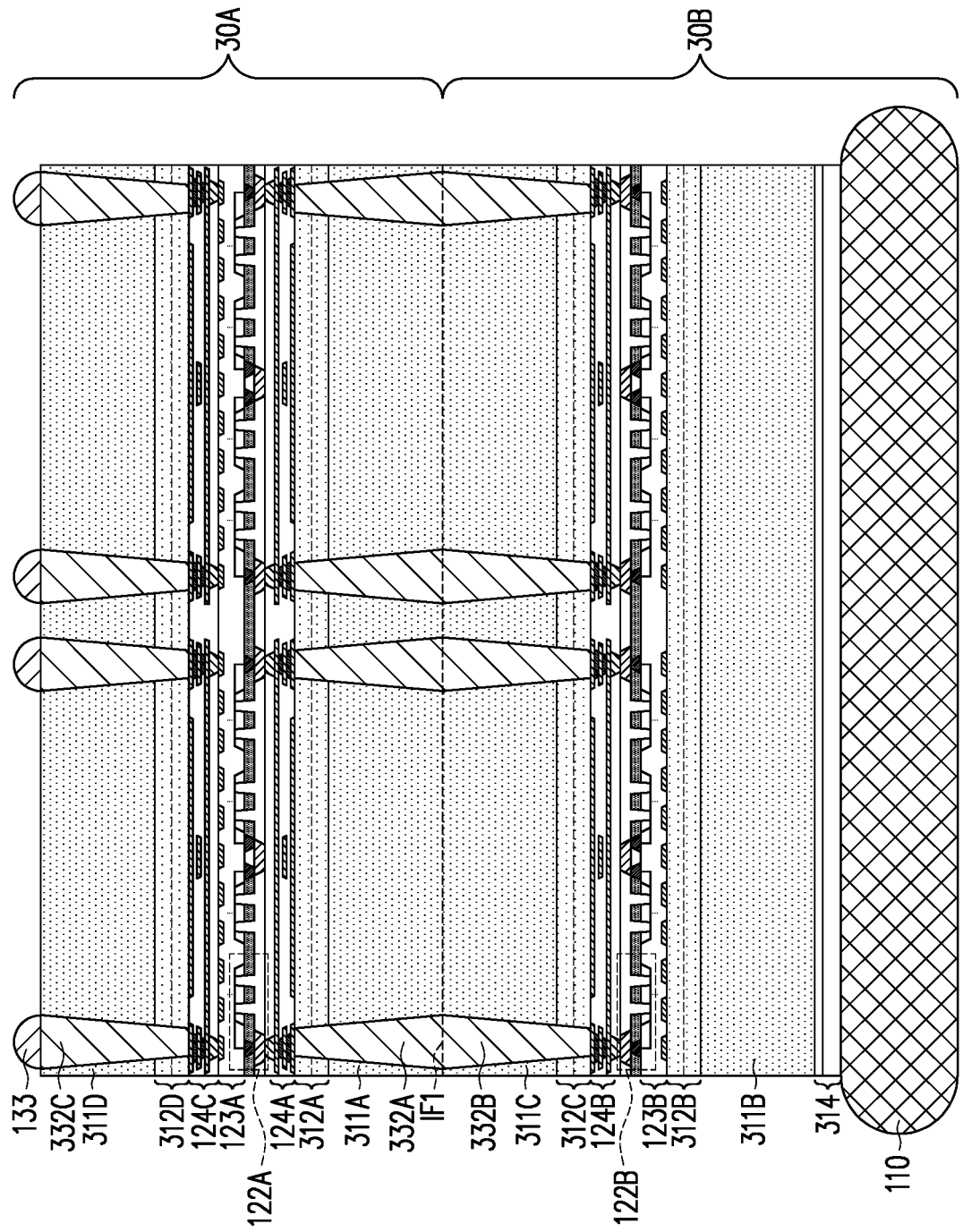

Referring to FIG. 3G and with reference to FIG. 3F, the third temporary carrier 110T_3 may be detached from the underlying structure through the de-bonding layer 314_1 by using the de-bonding process. After the de-bonding process, the fourth heat dissipation layer 311D may be accessibly revealed. Next, third through vias 332C may be formed and extend through the fourth heat dissipation layer 311D and the underlying fourth bonding layer 312D to be in physical and electrical contact with the topmost one of the metallization patterns 1241C of the third interconnect structure 124C. In some embodiments, the third through vias 332C and the second through vias 332B are tapered toward the same direction. In alternative embodiments, the third through vias 332C and/or the second through vias 332B have substantially vertical sidewalls. In some embodiments, the conductive terminals 133 are formed on the fourth heat dissipation layer 311D and may be electrical and physical coupled to the third through vias 332C. The conductive terminals 133 may be electrically coupled to the first semiconductor devices 122A through the third through vias 332C, the third interconnect structure 124C, and the first front-side metallization patterns 123A.

A semiconductor structure 30 including a first tier 30A stacked upon and bonded to a second tier 30B is then provided as shown in FIG. 3G. For example, the interface IF1 between the first tier 30A and the second tier 30B include metal-to-metal bonds, dielectric-to-dielectric bonds, and/or metal-to-dielectric bonds. In some embodiments, the first semiconductor devices 122A in the first tier 30A and the second semiconductor devices 122B in the second tier 30B are electrically coupled through the first backside interconnect structure 124A, the first through vias 332A, the second through vias 332B, and the second backside interconnect structure 124B. In some embodiments, the heat dissipation layers (e.g., 311A-311D) in the semiconductor structure 30 are of the same (or similar) material(s). The bonding layers (e.g., 312A-312D) in the semiconductor structure 30 may be of the same (or similar) material(s), e.g., a metal-containing oxide layer. The heat dissipation layers (e.g., 311A-311D) may have the thermal conductivity greater than the thermal conductivity of the bonding layers (e.g., 312A-312D). The heat generated in the semiconductor devices (e.g., 122A and 122B) may be transferred upward and/or downward to dissipate to the external environment through the heat dissipation layers (e.g., 311A-311D). The configuration of the heat dissipation layers (e.g., 311A-311D) may improve thermal dissipation performance of the stacked semiconductor structure.

Figure 4:
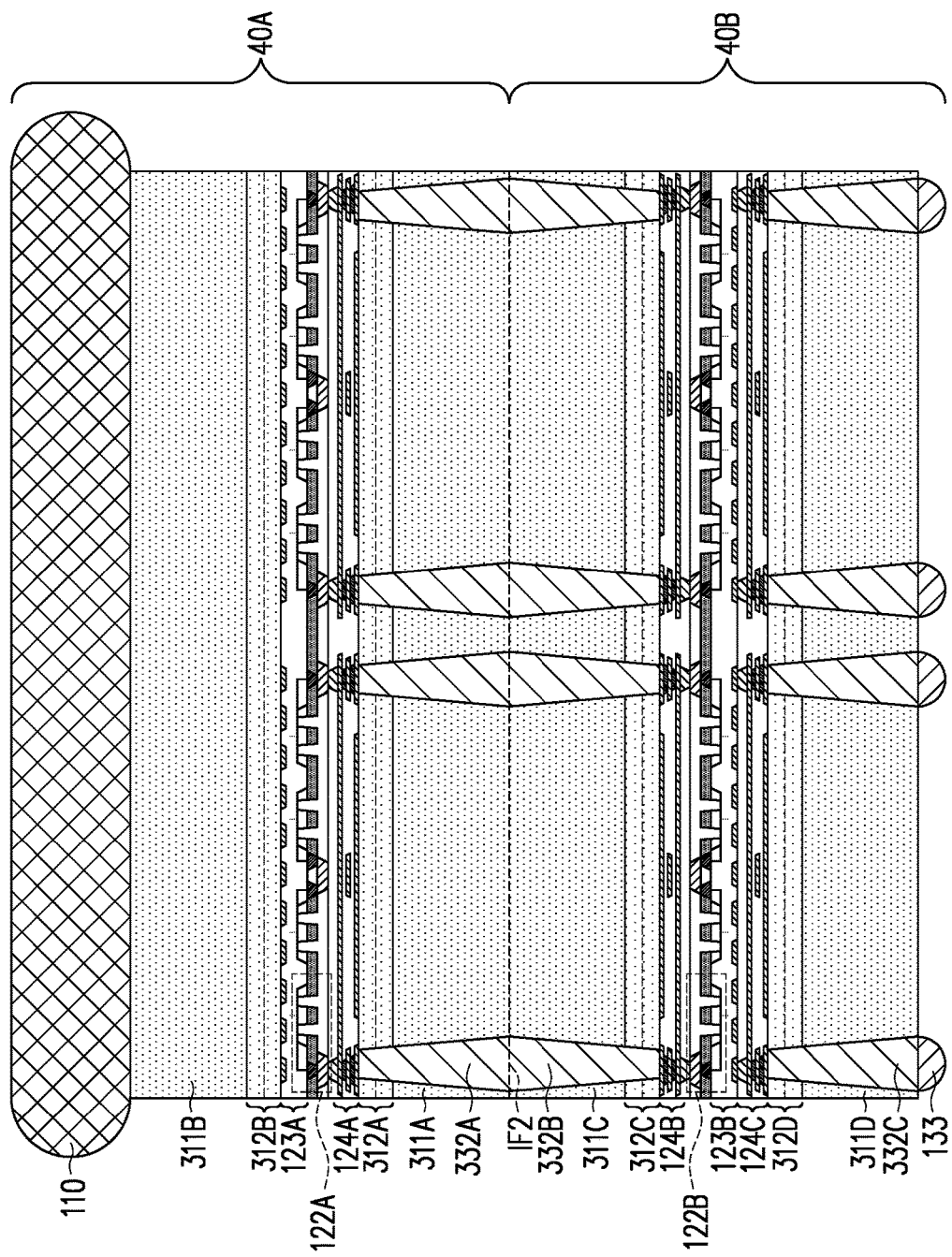
FIG. 4 is a schematic cross-sectional view of a semiconductor structure according to some embodiments.

FIG. 4 is a schematic cross-sectional view of a semiconductor structure according to some embodiments. It is noted that the identical/similar components are marked with identical/similar numerals, and for simplicity reason, the identical/similar components are not repeated herein. Referring to FIG. 4 and with reference to FIG. 3G, a semiconductor structure 40 including a first tier 40A stacked upon and bonded to a second tier 40B is provided. The semiconductor structure 40 is similar to the semiconductor structure 30 shown in FIG. 3G, and the difference therebetween includes that the carrier substrate 110, the second heat dissipation layer 311B, and the second bonding layer 312B are disposed in the first tier 40A, while the third interconnect structure 124C, the fourth heat dissipation layer 311D, the third through vias 332C, and the conductive terminals 133 are disposed in the second tier 40B. For example, the third interconnect structure 124C is formed below the second front-side interconnect structure 123B of the second tier 40B. In such configuration, the conductive vias in the second front-side interconnect structure 123B and third interconnect structure 124C are tapered in the same direction as the third through vias 332C.

In accordance with some embodiments, a semiconductor structure includes a first nitride-containing layer on a side of a carrier substrate, first semiconductor devices thermally coupled to the first nitride-containing layer, a first interconnect structure physically and electrically coupled to first sides of the first semiconductor devices, and a first metal-containing dielectric layer bonding the first nitride-containing layer to the first interconnect structure. A thermal conductivity of the first nitride-containing layer is greater than a thermal conductivity of the first metal-containing dielectric layer.

In accordance with some embodiments, a semiconductor structure includes a front-side interconnect structure and a backside interconnect structure disposed on two opposing sides of a layer of semiconductor devices, a heat dissipation layer thermally coupling the layer of semiconductor devices to a carrier substrate, and a metal oxide layer bonding the heat dissipation layer to the front-side interconnect structure or the backside interconnect structure. A thermal conductivity of the heat dissipation layer is greater than a thermal conductivity of the metal oxide layer.

In accordance with some embodiments, a manufacturing method of a semiconductor structure includes at least the following steps. A first metal oxide sublayer of a first portion is bonded to a second metal oxide sublayer of a second portion to form a bonding layer. The first portion includes a nitride-containing layer formed on a substrate and the first metal oxide sublayer formed on the nitride-containing layer, and a thermal conductivity of the nitride-containing layer is greater than a thermal conductivity of the bonding layer. The second portion includes semiconductor devices, a first interconnect structure formed on first sides of the semiconductor devices, and the second metal oxide sublayer formed on the first interconnect structure, where the semiconductor devices are thermally coupled to the nitride-containing layer, and the thermal conductivity of the bonding layer is greater than a thermal conductivity of an interconnect dielectric layer of the first interconnect structure. A second interconnect structure is formed on second sides of the semiconductor devices opposite to the first sides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first nitride-containing layer on a side of a carrier substrate;
   first semiconductor devices thermally coupled to the first nitride-containing layer;
   a first interconnect structure physically and electrically coupled to first sides of the first semiconductor devices; and
   a first metal-containing dielectric layer bonding the first nitride-containing layer to the first interconnect structure, wherein a thermal conductivity of the first nitride-containing layer is greater than a thermal conductivity of the first metal-containing dielectric layer.

2. The semiconductor structure of claim 1, further comprising:
   a second interconnect structure physically and electrically coupled to second sides of the first semiconductor devices opposite to the first sides, wherein the first sides comprise gate electrodes and the second sides comprise source/drain regions.

3. The semiconductor structure of claim 2, wherein the first interconnect structure, the first metal-containing dielectric layer, the first nitride-containing layer, and the carrier substrate are sequentially disposed on the first sides of the first semiconductor devices.

4. The semiconductor structure of claim 2, further comprising:
   a second nitride-containing layer bonding to the second interconnect structure through a second metal-containing dielectric layer; and
   second semiconductor devices disposed over the second nitride-containing layer and electrically coupled to the first semiconductor devices through a through via extending through the second nitride-containing layer and the second metal-containing dielectric layer.

5. The semiconductor structure of claim 4, wherein the through via comprises a first portion and a second portion disposed between the first portion and the second interconnect structure, the first portion is tapered in a direction from the second portion toward the second semiconductor devices, and the second portion is tapered in a different direction.

6. The semiconductor structure of claim 4, further comprising:
   a third interconnect structure disposed on and electrically coupled to the second semiconductor devices and the through via; and a third metal-containing dielectric layer interposed between the third interconnect structure and the second nitride-containing layer, wherein the through via passes through the third metal-containing dielectric layer.

7. The semiconductor structure of claim 6, further comprising:
a fourth interconnect structure disposed on and electrically coupled to the second semiconductor devices, wherein the third interconnect structure and the fourth interconnect structure are disposed at two opposing sides of the second semiconductor devices;
a third nitride-containing layer disposed over the fourth interconnect structure; and
a fourth metal-containing dielectric layer interposed between the fourth interconnect structure and the third nitride-containing layer.

8. The semiconductor structure of claim 1, wherein the first nitride-containing layer is a cubic boron nitride layer.

9. A semiconductor structure, comprising:
a front-side interconnect structure and a backside interconnect structure disposed on two opposing sides of a layer of semiconductor devices;
a heat dissipation layer thermally coupling the layer of semiconductor devices to a carrier substrate; and
a metal oxide layer bonding the heat dissipation layer to the front-side interconnect structure or the backside interconnect structure, wherein a thermal conductivity of the heat dissipation layer is greater than a thermal conductivity of the metal oxide layer.

10. The semiconductor structure of claim 9, wherein the heat dissipation layer is bonded to the front-side interconnect structure through the metal oxide layer, and the thermal conductivity of the metal oxide layer is greater than a thermal conductivity of interconnect dielectric layers of the front-side interconnect structure and the backside interconnect structure.

11. The semiconductor structure of claim 9, wherein the heat dissipation layer is bonded to the backside interconnect structure through the metal oxide layer, and a through via extends through the heat dissipation layer and the metal oxide layer to be physically coupled to the backside interconnect structure.

12. The semiconductor structure of claim 9, wherein the heat dissipation layer is bonded to the front-side interconnect structure through the metal oxide layer, and the semiconductor structure further comprises:
an additional heat dissipation layer bonding to the backside interconnect structure through an additional metal oxide layer, wherein a through via extending through the additional heat dissipation layer and the additional metal oxide layer to be physically coupled to the backside interconnect structure; and
an additional layer of semiconductor devices spaced apart from the layer of semiconductor devices through the additional heat dissipation layer and electrically coupled to the layer of semiconductor devices through the through via.

13. The semiconductor structure of claim 9, wherein the heat dissipation layer is a cubic boron nitride layer.

14. A semiconductor structure, comprising:
a first tier comprising:
a first layer of semiconductor devices comprising a first side and a second side opposite to the first side;
a first heat dissipation layer disposed over the first side of the first layer of semiconductor devices;
a first metal oxide layer interposed between the first heat dissipation layer and the first side of the first layer of semiconductor devices;
a second heat dissipation layer disposed over the second side of the first layer of semiconductor devices;
a second metal oxide layer interposed between the second heat dissipation layer and the second side of the first layer of semiconductor devices;
a first through via electrically coupled to the first layer of semiconductor devices and penetrating through the second heat dissipation layer and the second metal oxide layer; and
a second tier comprising:
a third heat dissipation layer bonded to the second heat dissipation layer;
a second through via penetrating through the third heat dissipation layer and bonded to the first through via.

15. The semiconductor structure of claim 14, wherein the second tier further comprises:
a second layer of semiconductor devices comprising a first side and a second side opposite to the first side, wherein the third heat dissipation layer and the second through via are disposed over the first side of the second layer of semiconductor devices.

16. The semiconductor structure of claim 15, wherein the second tier further comprises:
a fourth heat dissipation layer disposed over the second side of the second layer of semiconductor devices; and
a third metal oxide layer interposed between the fourth heat dissipation layer and the second side of the second layer of semiconductor devices.

17. The semiconductor structure of claim 14, wherein the first through via is tapered in a first direction, the second through via is tapered in a second direction opposite to the first direction.

18. The semiconductor structure of claim 14, wherein:
the first through via comprises a first end and a second end opposite to the first end and wider than the first end,
the second through via comprises a first end and a second end opposite to the first end and wider than the first end,
the second end of the first through via is bonded to the second end of the second through via.

19. The semiconductor structure of claim 14, wherein a thermal conductivity of the first heat dissipation layer is greater than a thermal conductivity of the first metal oxide layer.

20. The semiconductor structure of claim 14, wherein bonding interfaces of the first through via and the second heat dissipation layer are substantially coplanar.

* * * * *